United States Patent
Ybanez et al.

(10) Patent No.: US 12,095,347 B2
(45) Date of Patent: Sep. 17, 2024

(54) COOLING DEVICE FOR USE IN ALTERNATING MAGNETIC FIELDS, COIL ARRANGEMENT, ELECTRIC MACHINE, AND AIRCRAFT

(71) Applicant: Airbus (S.A.S.), Blagnac (FR)

(72) Inventors: Ludovic Ybanez, Taufkirchen (DE); Lucien Prisse, Taufkirchen (DE); Jorge A. Carretero Benignos, Taufkirchen (DE); Jürgen Steinwandel, Taufkirchen (DE); Michael Hofmann, Taufkirchen (DE)

(73) Assignee: Airbus (S.A.S.), Blagnac (FR)

( * ) Notice: Subject to any disclaimer, the term of this patent is extended or adjusted under 35 U.S.C. 154(b) by 389 days.

(21) Appl. No.: 17/314,459

(22) Filed: May 7, 2021

(65) Prior Publication Data
US 2021/0351666 A1 Nov. 11, 2021

(30) Foreign Application Priority Data

May 8, 2020 (DE) ..................... 10 2020 112 591.7

(51) Int. Cl.
 *H02K 3/24* (2006.01)
 *B64D 27/24* (2006.01)
 *H02K 9/20* (2006.01)
 *H02K 9/22* (2006.01)
 *H05K 7/20* (2006.01)

(52) U.S. Cl.
 CPC ............... *H02K 9/20* (2013.01); *B64D 27/24* (2013.01); *H02K 3/24* (2013.01); *H02K 9/225* (2021.01); *H05K 7/20309* (2013.01); *H05K 7/20318* (2013.01); *H05K 7/20336* (2013.01)

(58) Field of Classification Search
 CPC .......................... H02K 9/225; H05K 7/20336
 See application file for complete search history.

(56) References Cited

U.S. PATENT DOCUMENTS

| 4,240,000 A | 12/1980 | Harano et al. |
| 4,541,261 A * | 9/1985 | Yanadori ............... F28D 15/046 29/890.032 |
| 6,536,510 B2 | 3/2003 | Khrustalev et al. |
| 6,943,467 B2 | 9/2005 | Potoradi et al. |

(Continued)

FOREIGN PATENT DOCUMENTS

| CN | 201090951 Y | * 7/2008 |
| CN | 205249520 U | * 5/2016 |

(Continued)

OTHER PUBLICATIONS

European Search Report for Application No. 21171929 dated Sep. 23, 2021.

(Continued)

Primary Examiner — Ramon M Barrera
(74) Attorney, Agent, or Firm — KDW Firm PLLC

(57) ABSTRACT

A cooling device for use in alternating magnetic fields include an evaporator part defining a first volume for evaporating a cooling medium contained therein, the evaporator part being made of an electrically and magnetically non-conductive material, and a condenser part defining a second volume for condensing the cooling medium contained therein, the condenser part being in fluid connection with the first volume.

13 Claims, 5 Drawing Sheets

(56) References Cited

U.S. PATENT DOCUMENTS

| | | | |
|---|---|---|---|
| 2006/0196651 A1 | 9/2006 | Board et al. | |
| 2009/0213613 A1 | 8/2009 | Mitic et al. | |
| 2010/0026109 A1 | 2/2010 | Hassett et al. | |
| 2014/0368064 A1 | 12/2014 | Fedoseyev et al. | |
| 2018/0175704 A1 | 6/2018 | Huber et al. | |
| 2019/0090386 A1* | 3/2019 | Shioga | F28D 15/046 |
| 2019/0350111 A1* | 11/2019 | Bodla | F24S 10/95 |

FOREIGN PATENT DOCUMENTS

| | | |
|---|---|---|
| DE | 102 58 778 A1 | 7/2004 |
| DE | 10 2016 218 741 A1 | 3/2018 |
| DE | 10 2018 210 985 A1 | 1/2020 |
| EP | 3 569 960 A2 | 11/2019 |
| JP | S60-118039 A | 6/1985 |
| WO | WO 2016/058966 A1 | 4/2016 |
| WO | WO 2017/076684 | 5/2017 |
| WO | WO 2018/060011 A1 | 4/2018 |

OTHER PUBLICATIONS

German Search Report for Application No. 10 2020 112 591.7 dated Feb. 26, 2021.

\* cited by examiner

COOLING DEVICE FOR USE IN ALTERNATING MAGNETIC FIELDS, COIL ARRANGEMENT, ELECTRIC MACHINE, AND AIRCRAFT

CROSS-REFERENCE TO RELATED APPLICATION

This application claims priority to German Patent Application No. 10 2020 112 591.7 filed May 8, 2020, the entire disclosure of which is incorporated by reference herein.

TECHNICAL FIELD

The disclosure herein pertains to a cooling device for use in alternating magnetic fields, a coil arrangement for generating or receiving alternating magnetic fields, for example, a stator of an electric motor, an electric machine such as an electric motor, and an aircraft being equipped with the electric machine.

Although applicable for any kind of device that generates alternating or temporary varying magnetic fields, the disclosure herein and the corresponding underlying problems will be explained in further detail in conjunction with an electric machine, in particular an electric motor.

BACKGROUND

Heat pipes are cooling devices that typically comprise an evaporator part and a condenser part interconnected via pipe and form a self-contained, closed system. A cooling medium is contained within the heat pipe. In the evaporator part, the cooling medium absorbs heat from the structure to be cooled and evaporates. The evaporated, gaseous cooling medium travels to the condenser part where it condenses again.

Heat pipes are able to realize high cooling rates in restricted volume at almost constant temperature. Typically, heat pipes are made of metal materials which provide high thermal conductivity.

Many technical applications for creating electromagnetic fields include coils which, however, develop heat due to losses. Consequently, cooling is required to improve efficiency, e.g. in a rotatory electric machine.

WO 2017/076684 and US 2014/0368064 A1 each describe cooling a rotor of an electric machine by a heat pipe. describes a similar application. U.S. Pat. No. 4,240,000 A describes a heat pipe arranged in a rotor shaft of a rotor of an electric machine. These documents, thus, use a heat pipe in the part of the machine which rotates with the same or similar speed of the magnetic flux fundamental wave. Consequently, no or almost no speed difference between flux and heat pipe position arises, resulting in no or low electric induction in the heat pipe. DE 102 58 778 A1 describes an electric machine with heat pipes being provided in a slot between rotor and stator.

Giessler, Sattler, and Thoren in "Heat Pipe Cooling of Electrical Machines" (Heat pipe cooling of large electric motors, Naval Postgraduate School, Monterey, 1988", pages 557ff.) describe employing copper-made heat pipes at the bottom of slots in a stator iron of an electric machine.

SUMMARY

It is one of the objects of the disclosure herein to provide improved solutions for cooling of structures subject to magnetic fields.

According to a first aspect of the disclosure herein, a cooling device for use in alternating magnetic fields comprises an evaporator part defining a first volume for evaporating a cooling medium contained therein, the evaporator part being made of an electrically and magnetically non-conductive material, and a condenser part defining a second volume for condensing the cooling medium contained therein, the condenser part being in fluid connection with the first volume.

According to a second aspect of the disclosure herein, a coil arrangement for generating or receiving alternating magnetic fields comprises a carrier part, a plurality of windings wound about the carrier part, and a cooling device according to the first aspect of the disclosure herein. The evaporator part of the cooling device is arranged overlapping with the windings, and the condenser part is arranged non-overlapping with or separated from the windings.

According to a third aspect of the disclosure herein, an electric machine, e.g. an electric motor, comprises a stator comprising a coil arrangement according the second aspect of the disclosure herein, wherein the stator defines a rotational axis. The carrier part may be formed by a stator yoke, for example, to which a plurality of windings are wound or applied. The electric machine further includes a rotor being rotatably mounted relative to the stator about the rotational axis.

According to a fourth aspect of the disclosure herein, an aircraft comprises an electric machine according to the third aspect of the disclosure herein, for example, as a motor for driving a fan or propeller in order to generate thrust.

One idea of the disclosure herein is to provide cooling device in the form of a heat pipe having an evaporator part which is provided for arrangement within an area of high magnetic fields, for example, directly adjacent to windings of coils that generate or receive temporary varying magnetic fields, wherein the evaporator part is made of a material which is an electrical insulator, e.g. a material having a specific resistivity of greater or equal than $10^7$ Ωcm, and which is non-magnetic or non-magnetizable. A condenser part of the cooling device is arranged in an area of where no magnetic fields are present or where only magnetic fields are present that are low compared to the magnetic fields present in the area where the evaporator part is located. For example, the evaporator part may be integrated into an interior of a stator of an electric motor or generator while the condenser part protrudes from an outside of the stator. Of course, other applications of the cooling are possible, e.g. in coil arrangements of a pulse generator of a radar system, in radio sending devices, and so on.

An advantage of the evaporator part made of electrically and magnetically non-conductive material is that alternating magnetic fields are not able to induce electric currents within the evaporator part as it would be the case for magnetically and/or electrically conductive materials. Therefore, the evaporator part is not heated by magnetic fields itself when being located within an area of temporary varying magnetic fields. Consequently, an amount of heat that can be received for cooling purposes by the cooling medium of the cooling device is increased.

A further advantage may be seen in that the evaporator part of the cooling device can be arranged overlapping and/or adjacent to windings of a coil arrangement, e.g. within the stator of an electric motor. Thereby, cooling of the windings is improved while influences the magnetic fields within the coil arrangement are advantageously reduced or even avoided.

Since the evaporator part is electrically non-conductive, the evaporator part may be positioned very close or even in direct contact with the windings, whereby the cooling efficiency can be increased further. Another advantage of making the evaporator part from an electrically non-conductive material is that electric currents can be prevented from being conducted from the windings of the cooled coil arrangement to structures in the surrounding thereof. Thereby, operative safety and reliability of an electric machine having such a coil arrangement may be increased which is particularly advantageous in aircraft applications.

According to some embodiments the evaporator part may be made of a ceramic material. In particular, the evaporator part may be made of an AlSiC material, e.g. AlSiC-9, AlSic-10, or AlSiC-12. AlSiC materials provide the benefit of a high thermal conductivity, which may lie within a range between 180-200 W/m K, combined with a high specific electrical resistivity, which may lie within a range between $10^8$ to $10^9$ Ωcm.

According to some embodiments, the condenser part may be made of a metal material, for example copper or aluminum. Since the condenser part is provided for being located in an area of no or only low magnetic fields, use of magnetic and/or electric conductors is possible without degrading the efficiency of the cooling device due to heating currents induced by alternating magnetic fields. Metal materials provide the benefit of excellent heat conductivity and therefore help to further increase efficiency of the cooling device.

According to some embodiments, the evaporator part may be formed by a first pipe comprising a first opening formed at an axial end of the first pipe, and the condenser part may comprise a second pipe comprising a second opening formed at an axial end of the second pipe, wherein the axial end of the second pipe is introduced into the first opening of the first pipe. Hence, the evaporator part and the condenser part may be realized as pipes, wherein the pipe forming the condenser part may be introduced into an opening of the pipe forming the evaporator part. The pipes may not only be realized as straight, axially extending pipes but may also comprise curved or angled sections. By introducing an end of the second or condenser pipe into the opening of the first or evaporator pipe, a constructive simple device is realized which may easily be assembled. In particular, when the condenser pipe is made of metal material and when the evaporator pipe is made of a ceramic material, an improved sealing of the inner volume defined by the first volume of the evaporator part and the second volume of the condenser part may be achieved.

According to one example embodiment, the first pipe may include an inner surface that defines a cross-section of the first volume, the inner surface being metalized in a region adjacent to the first opening, and an outer surface of the second pipe may be joined to the metalized region of the inner surface of the first pipe. That is an inner diameter of the opening of the first pipe may be coated with a metal layer, wherein an outer diameter at the end of the second pipe may be integrally joined to the metal layer of the first pipe. Thereby, a connection between the evaporator pipe and the condenser pipe is realized which has high mechanical robustness and further improved fluid sealing properties.

According to some embodiments, non-conductive fibers may extend from the second volume defined by the second pipe into the first volume defined by the first pipe to transport condensed cooling medium from the condenser part to the evaporator part by capillary forces. The fibers may be made of an electrically non-conductive material. For example, the fibers may be glass fibers or aramid fibers. The fibers may extend all the way through the first and second pipes, in particular from an axial end of the first pipe that is located opposite to the first opening to an axial and of the second pipe that is located opposite to the second opening. Fibres provide the benefit that they can easily be introduced into the pipes which eases assembling of the cooling device.

According to some embodiments, an inner surface of the first pipe that defines a cross-section of the first volume may comprise a plurality of first grooves extending towards the first opening, and an inner surface of the second pipe that defines a cross-section of the second volume may comprise a plurality of second grooves extending towards the second opening, wherein the first grooves and the second grooves are aligned to each other to transport condensed cooling medium from the condenser part to the evaporator part by capillary forces. In addition, or as an alternative to non-conductive fibers, grooves may be provided on the inner surfaces on of the pipes. The first grooves of the first pipe may extend linearly from an axial end of the first pipe located opposite to the first opening to the first opening. Similar, the second grooves of the second pipe may extend linearly from an axial end of the second pipe located opposite to the second opening to the second opening. Further, the first and second pipes are positioned relative to each other such that at least some the first and the second grooves together form continuous channels. One advantage of providing grooves may be seen in reduced weight of the cooling device. A further advantage may result from the fact that the grooves in the evaporator part are part of the solid, non-conductive material, thus providing minimal thermal resistance between the solid non-conductive material and the liquid in the grooves.

According to some embodiments of the coil arrangement, the evaporator part may be arranged between the carrier part and the windings. That is, the evaporator part may be sandwiched between a surface of the carrier part and the windings. One advantage of arranging the evaporator part directly between carrier part and winding is that impacts of the evaporator part to the guidance of magnetic fields can be further reduced.

According to some embodiments of the coil arrangement, the evaporator part may be arranged between two adjacent windings. Thereby, an area of heat transfer is increased. At the same time, a length of thermally conductive path from the height of the winding package to the evaporator part is reduced. Consequently, cooling efficiency is further improved.

According to some embodiments of the coil arrangement, the evaporator part may be arranged onto an outermost winding facing away from the carrier part. Thereby, installation of the cooling arrangement is eased.

According to some embodiments of the electric machine, the evaporator part of the cooling device of the stator extends along the rotational axis, wherein the condenser part protrudes from an axial end of the stator. Thus, a space saving arrangement of the cooling devices is provided which results in compact electric machine. Moreover, heat can be efficiently transported away from the stator over its whole length.

BRIEF DESCRIPTION OF THE DRAWINGS

The disclosure herein will be explained in greater detail with reference to example embodiments depicted in the drawings as appended.

The accompanying drawings are included to provide a further understanding of the disclosure herein and are incorporated in and constitute a part of this specification. The drawings illustrate the embodiments of the disclosure herein and together with the description serve to explain the principles of the disclosure herein. Other embodiments of the disclosure herein and many of the intended advantages of the disclosure herein will be readily appreciated as they become better understood by reference to the following detailed description. The elements of the drawings are not necessarily to scale relative to each other. Like reference numerals designate corresponding similar parts.

Figure 1:
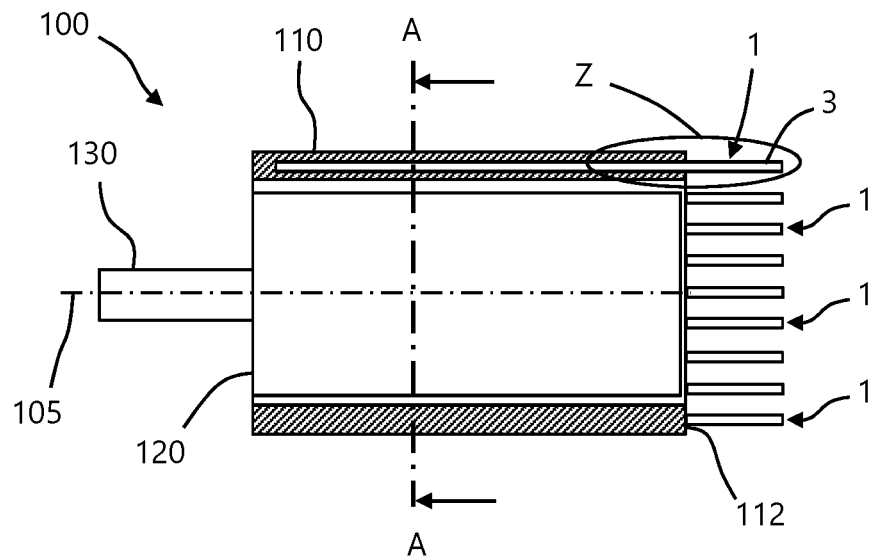
FIG. 1 schematically illustrates a cross-sectional view an electric machine according to an embodiment of the disclosure herein.

In the figures, like reference numerals denote like or functionally like components, unless indicated otherwise. Any directional terminology like "top", "bottom", "left", "right", "above", "below", "horizontal", "vertical", "back", "front", and similar terms are merely used for explanatory purposes and are not intended to delimit the embodiments to the specific arrangements as shown in the drawings.

DETAILED DESCRIPTION

Although specific embodiments have been illustrated and described herein, it will be appreciated by those of ordinary skill in the art that a variety of alternate and/or equivalent implementations may be substituted for the specific embodiments shown and described without departing from the scope of the disclosure herein. Generally, this application is intended to cover any adaptations or variations of the specific embodiments discussed herein.

FIG. 1 shows a simplified cross-sectional view of an electric machine 100, in particular an electric motor. As schematically shown in FIG. 1, the electric machine 100 may comprise a stator 110 and a rotor 120.

As exemplarily shown in FIG. 1, the stator 110 may be realized as substantially cylindrical part that defines a central, rotational axis 105. The stator 110 may comprise a coil arrangement 10 which is shown in a simplified, partial cross-sectional view in FIG. 2 and which will be explained in more detail below.

The rotor 120 may for example be arranged within an interior of the stator 110, as exemplarily shown in FIG. 1, whereby an inner rotor topology is realized. Alternatively, the rotor 120 may also be arranged so as to surround the stator 110 to realize an outer rotor topology. Generally, the rotor 120 may be rotatably mounted relative to the stator 110 about the rotational axis 105. As is shown in a very simplified and symbolic manner in FIGS. 3 to 5, the rotor 120 may include magnetic devices 121 which may be permanent magnets or coils acting as electro magnets. For example, the coil arrangement 10 of the stator 110 may be configured to generate a rotating magnetic field in order to rotate the rotor 120 about the rotational axis 105. Thereby, torque can be supplied to an output shaft 130 coupled to the rotor 120. The electric machine 100 may also work as a generator. In this case, the rotor 120 with magnetic devices 121 rotates and thereby generates a rotating magnetic field, which is received by the coil arrangement 10 of the stator 110.

Figure 9:
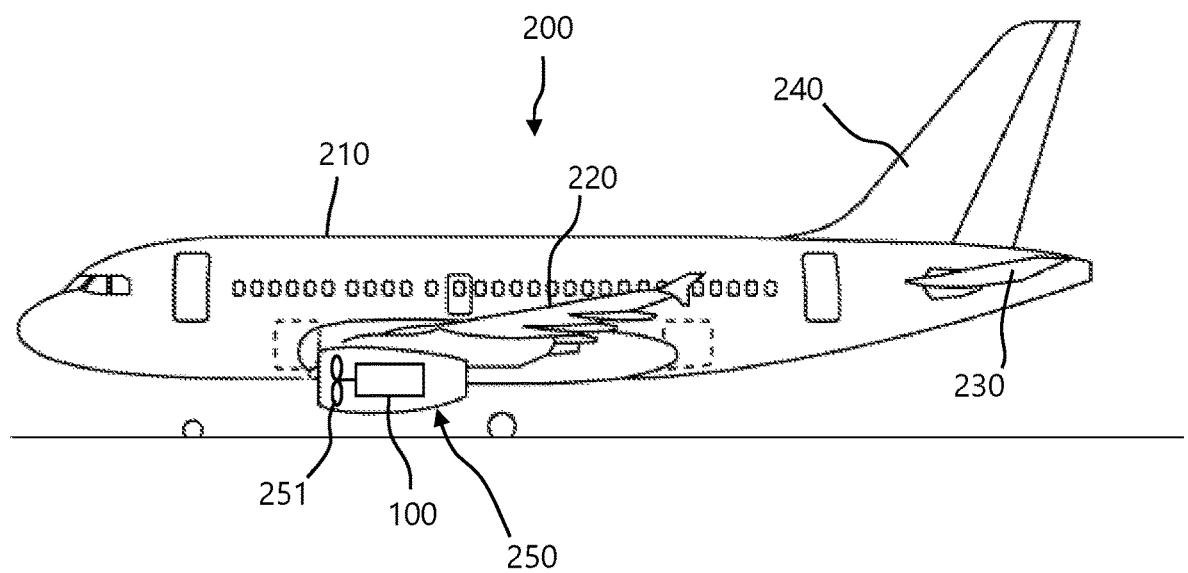
FIG. 9 schematically illustrates an aircraft according to an embodiment of the disclosure herein.

FIG. 9 exemplarily shows an aircraft 200. The aircraft 200 may comprise a fuselage 210 defining a cabin of the aircraft 200, wings 220, stabilizers 230, 240, and an engine 250. The engine 250 may be attached to one of the wings 220, as exemplarily shown in FIG. 9, or to another structure of the aircraft 200. The engine 250 may in particular include the electric motor 100 and a propeller or fan 251 driven by the electric motor 100 as is schematically shown in FIG. 9.

Figure 2:
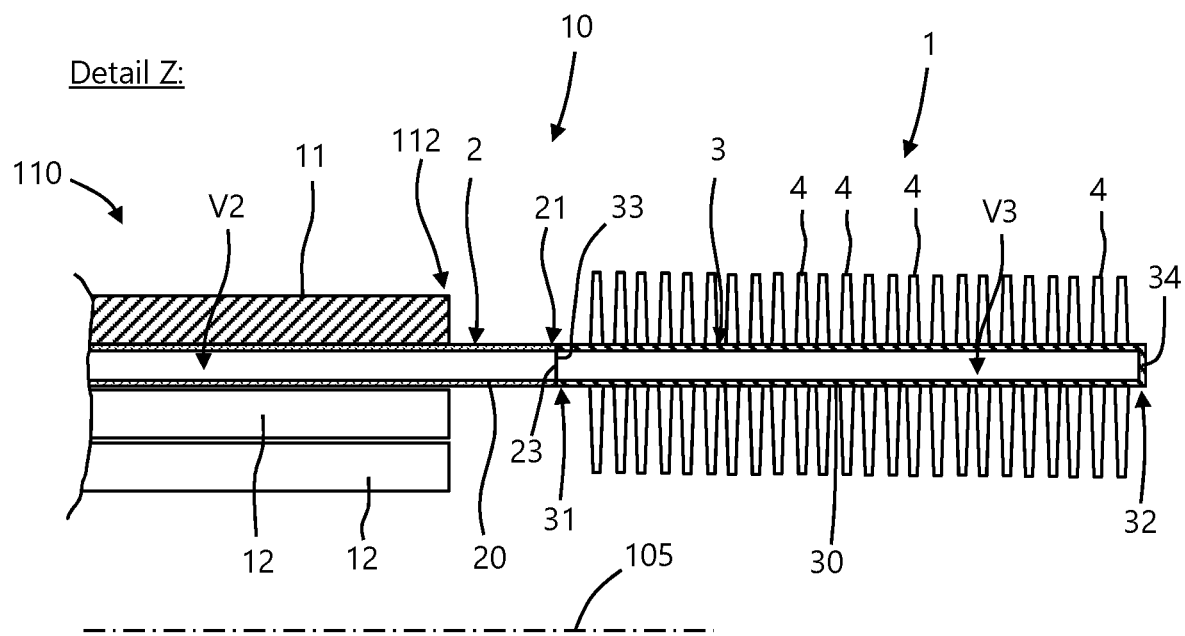
FIG. 2 schematically depicts detail Z of FIG. 1 and illustrates a coil arrangement according to an embodiment of the disclosure herein.
Figure 3:
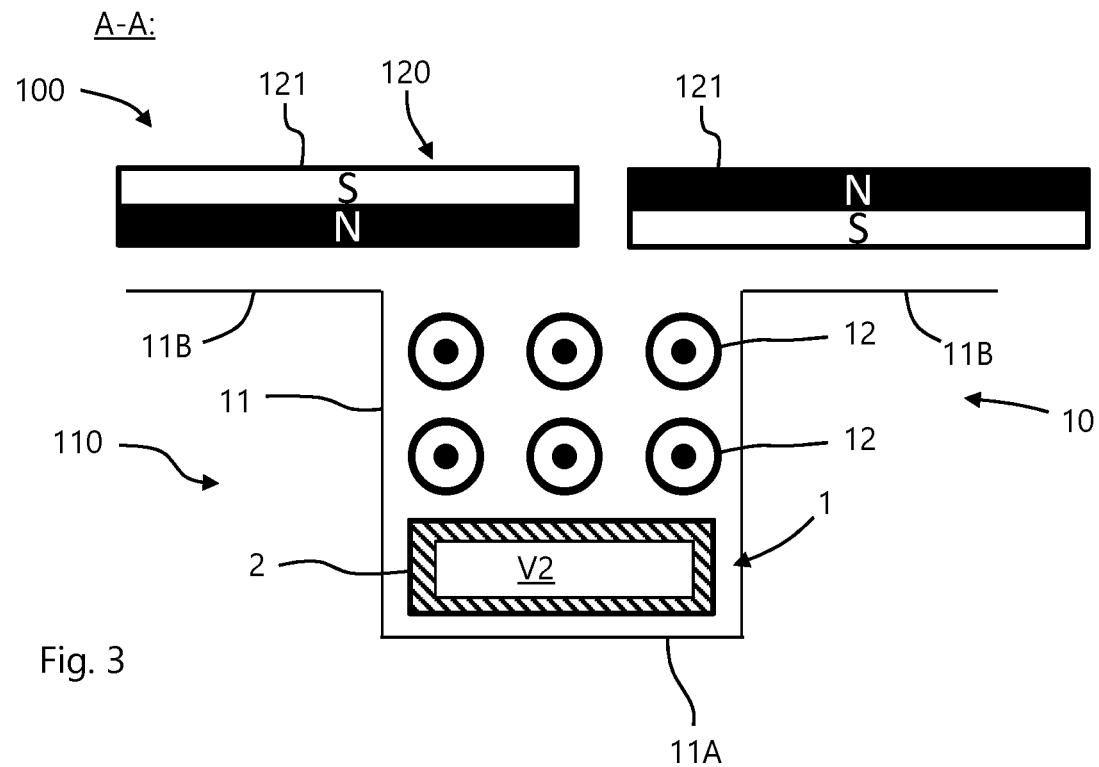
FIG. 3 schematically illustrates a partial cross-sectional view of an electric machine according to an embodiment of the disclosure herein, the cross-section being taken along line A-A in FIG. 1.
Figure 4:
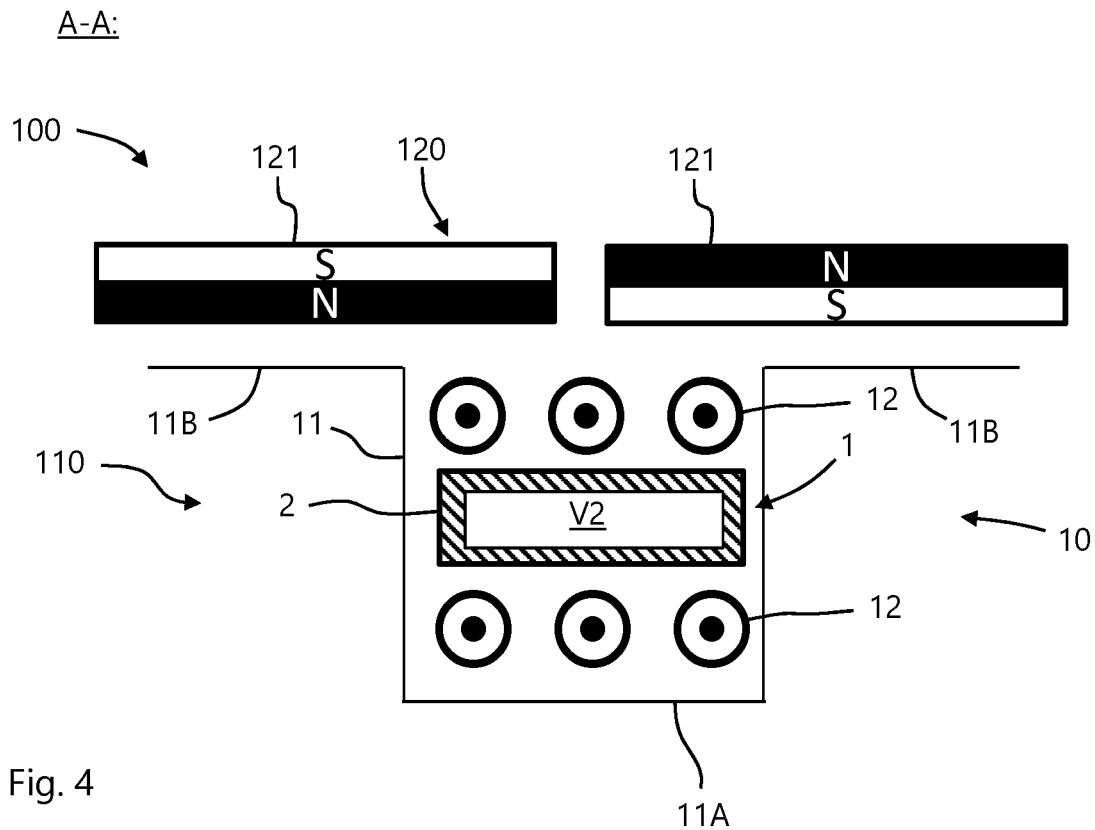
FIG. 4 schematically illustrates a partial cross-sectional view of an electric machine according to a further embodiment of the disclosure herein, the cross-section being taken along line A-A in FIG. 1.
Figure 5:
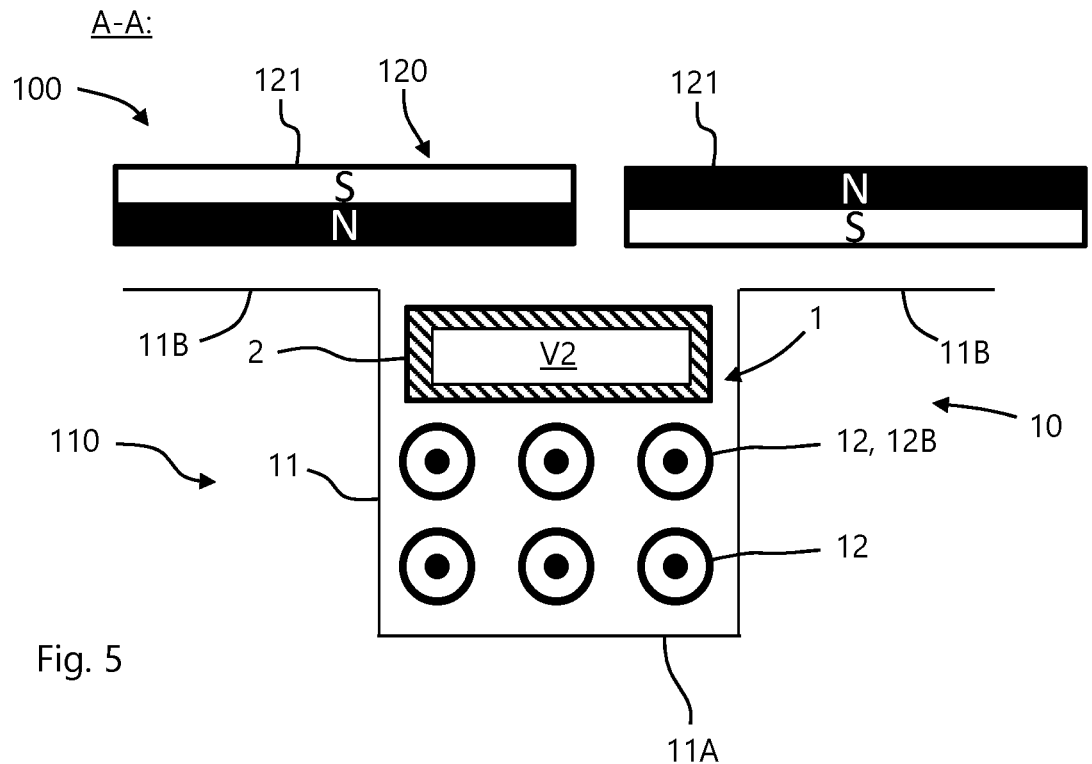
FIG. 5 schematically illustrates a partial cross-sectional view of an electric machine according to a further embodiment of the disclosure herein, the cross-section being taken along line A-A in FIG. 1.

Referring now to FIG. 2, the coil arrangement 10 may include a carrier part 11, a plurality of windings 12, and a cooling device 1. The carrier part 11 may, for example, be a stator yoke of the stator 110 of the electric machine 100. However, the disclosure herein is not limited to the electric machine 100 and the coil arrangement 10 may be used in other applications where temporary varying magnetic fields are to be generated. The carrier part 11 is only schematically shown in FIG. 2. When being a stator yoke, the carrier part 11 may comprise a yoke ring 11A and teeth 11B protruding radially inwards from the yoke ring for an inner rotor topology, for example, as schematically illustrated in FIGS. 3 to 5. In an outer rotor topology, the teeth 11B may protrude radially outwards from the yoke ring. The ring 11B surrounds the rotational axis 105, and the teeth 11B may extend along the rotational axis 105.

The windings 12 are typical coil windings and are wound about the carrier part 11 which is only schematically shown in FIG. 2. For example, several layers of windings 12 may be arranged over each other.

The cooling device 1 is schematically shown in FIG. 2 and may comprise an evaporator part 2, a condenser part 3, and optional cooling ribs or fins 4. The cooling device 1 is shown in further detail in FIGS. 6 to 8.

As exemplarily shown in FIGS. 2 and 6 to 8, the evaporator part 2 may be realized as a first pipe 20, which will also be referred to as evaporator pipe 20 in the following. The evaporator pipe 20 may, for example, be realized as a linearly or straight extending pipe or channel as schematically shown in FIGS. 2 and 6 to 8. However, it may also be possible that the evaporator pipe comprises curved and/or angled sections. Generally, the evaporator pipe 20 extends between a first axial or front end 21, where a first opening 23 may be provided, and an opposed second axial or rear end 22, where an end wall 24 may be provided. The evaporator pipe 20 includes an inner surface 20a which defines an inner cross-sectional shape of the evaporator pipe 20, e.g. a circular cross-section, a rectangular cross-section as exemplarily shown in FIGS. 3 to 5, or another cross-section defining a closed circumference. The evaporator pipe 20 shown in FIG. 2 and the evaporator pipes 20 shown in FIGS.

6 to 8 each comprise a constant inner diameter defined by the inner surface 20a between the first and second axial ends 21, 22. However, of course other configurations are possible. Generally, the evaporator pipe 20 defines a first volume V2.

Figure 6:
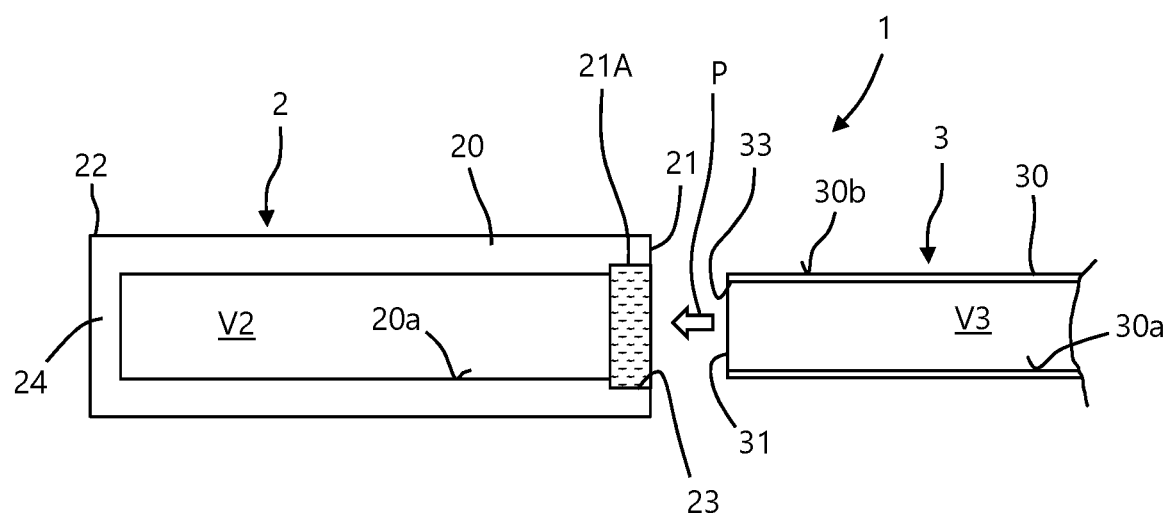
FIG. 6 schematically illustrates an exploded cross-sectional view a cooling device according to an embodiment of the disclosure herein.

As is visible best in FIG. 6, the inner diameter of the evaporator pipe 20 may optionally be widened at the first opening 23. For example, the inner surface 20a, in a region 21A extending from the first axial end 21, may define an inner diameter which is greater than the inner diameter defined by the inner surface 20a in the rest of the pipe 20. Optionally, the inner surface 20a may include a metal coating within the region 21A.

The evaporator part 2, irrespective of its shape, may be made of a material which is electrically non-conductive and which is neither magnetic nor magnetisable. In other words, the evaporator part 2 may be a magnetic and electric isolator. In particular, the evaporator part 2 may be made of a ceramic material, for example, an AlSiC material such as AlSiC-9, AlSiC-10, or AlSiC-12.

As exemplarily shown in FIGS. 2 and 6 to 8, the condenser part 3 may be realized as a second pipe 30, which will also be referred to as condenser pipe 30 in the following. Similar as the evaporator pipe 20, the second pipe 30 may, for example, be realized as a linearly or straight extending pipe or channel as schematically shown in FIGS. 2 and 6 to 8. However, it may also be possible that the second pipe 30 comprises curved and/or angled sections. Generally, the condenser pipe 30 extends between a first axial or front end 31, where a second opening 33 may be provided, and an opposed second axial or rear end 32, where an end wall 34 may be provided. The condenser pipe 30 includes an inner surface 30a which defines an inner cross-sectional shape of the condenser pipe 30, e.g. a circular cross-section, a rectangular cross-section, or another cross-section defining a closed circumference. The condenser pipe 30 shown in FIG. 2 and the condenser pipes 30 shown in FIGS. 6 to 8 each comprise a constant inner diameter defined by the inner surface 30a between the first and second axial ends 31, 32. However, of course other configurations are possible. Generally, the condenser pipe 30 defines a second volume V3.

The condenser part 3, irrespective of its shape, may be made of any material providing good heat transfer properties. Optionally, the condenser pipe 30 can be made of metal material, e.g. of aluminum or copper.

Generally, first volume V1 defined by the evaporator part 2 and the second volume V3 defined by the condenser part 3 are connected to each other so as to be in fluid communication. Thus, a cooling medium, for example, water or an organic phase change cooling medium, may be contained within the first and second volumes V2, V3. In order to cool a structure, liquid cooling medium absorbs heat in the evaporator part 2, evaporates and is transported to the condenser part 3 where it condenses. The condenser part 3 thereby discharges heat to the surrounding and the condensed, liquid cooling medium is transported back to the evaporator part 2. In order to further promote heat discharge from the condenser part 3, optional cooling fins 4 may be attached to an outer surface 30a of the condenser part 3, as exemplarily shown in FIG. 2. For example, a plurality of parallel cooling fins 4 may extend radially outward from the outer surface 30a of the condenser pipe 30, as schematically illustrated in FIG. 2. Alternatively, heat discharge from the condenser part 3 may be realised via a cooling liquid being delivered to the condenser part 3.

As exemplarily shown in FIGS. 2 and 6 to 8, the evaporator part 2 and the condenser part 3 may be directly connected to each other. Generally, the first axial end 21 of the evaporator pipe 20 may be joined to the first axial end 31 of the condenser pipe 30 so that the first volume V2 of the evaporator pipe 20 and the second volume V3 of the condenser pipe 30 are in fluid communication via the first opening 21 of the evaporator pipe 20 and the second opening 31 of the condenser pipe 30. However, it would also be possible to provide an intermediate part (not shown) between the first and second pipes 20, 30 in order to connect the first opening 21 and the second opening 31 to each other in a fluid conducting manner.

Figure 7:
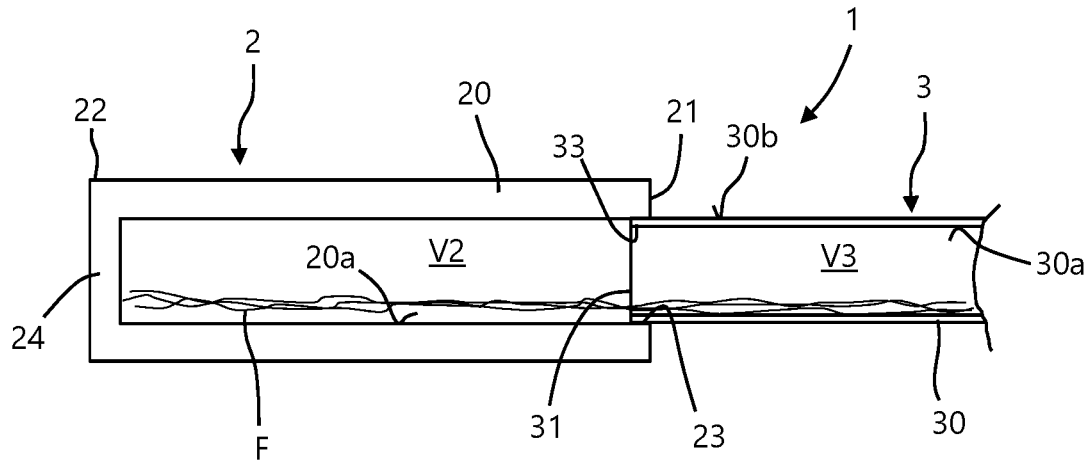
FIG. 7 schematically illustrates a cross-sectional view a cooling device according to a further embodiment of the disclosure herein.
Figure 8:
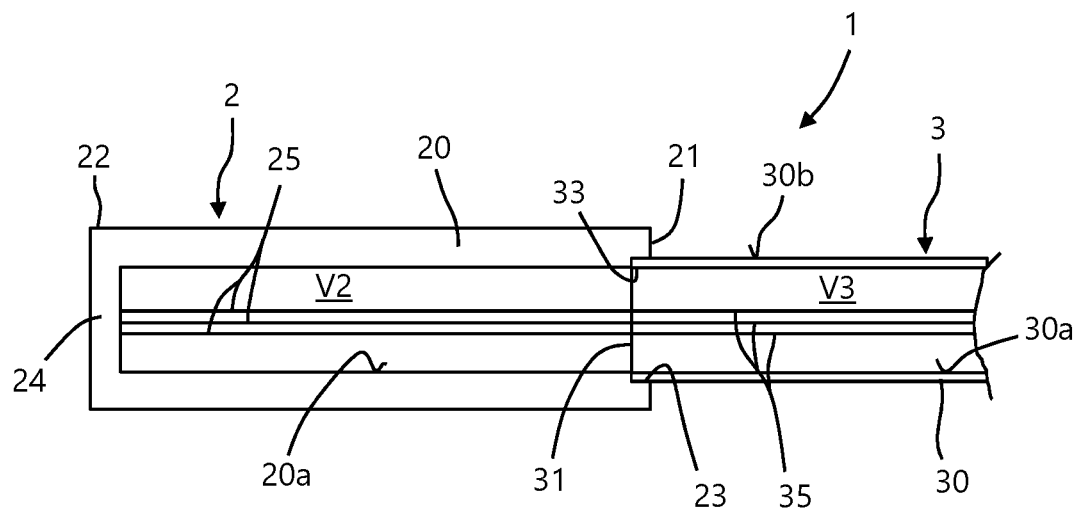
FIG. 8 schematically illustrates a cross-sectional view a cooling device according to a further embodiment of the disclosure herein.

As schematically illustrated in FIGS. 6 to 8, the first axial end 31 of the second pipe 30 may extend into and fixed within the first opening 23 of the first pipe 20. As symbolically indicated in FIG. 6 by arrow P the first axial end 31 of the second or condenser pipe 30 can be introduced into the first opening 23 of the first or evaporator pipe 20, in particular, into the widened or enlarged region 21A optionally provided adjacent to the first axial end 21 of the evaporator pipe 20. In particular, wall thickness of the condenser pipe 30 and the diameter of the enlarged region 21A of the evaporator pipe 20 may be dimensioned such that the inner surface 20a of the evaporator pipe 20 and the inner surface of the condenser pipe 30 are flush with each other. The wall thickness of the condenser pipe 30 may be measured between the inner surface 30a and an opposed outer surface 30b of the condenser pipe 30. To fix the first axial end 31 of the second pipe 30 within the first opening 23 of the first pipe 20, the optional metallization in region 21A of the inner surface 20a of the first pipe 20 and the outer surface 30a of the second pipe 30 may be joined, e.g. integrally joined, in particular by applying heat to the metallization and the first axial end 31 of the second pipe 30.

As exemplarily shown in FIG. 7, the cooling device 1 may optionally include non-conductive fibers F, e.g. glass fibers. The fibers F are provided within the first and second volume V2, V3 defined by the evaporator part 2 and the condenser part 3. In particular, the non-conductive fibers F extend from the second volume V3 into the first volume V3. As exemplarily shown in FIG. 7, the fibers F may extend all the way from the second axial or rear end 22 of the first or evaporator pipe 20 to the second axial or rear end 32 of the second or condenser pipe 3. The fibers F may fill a substantial part of the first and second volumes V2, V3, e.g. between 20% and 80% of the first and second volumes V2, V3. The fibers F help to transport condensed cooling medium from the condenser part 3 back to the evaporator part 2 by capillary forces.

Additionally, or alternatively to fibers F, grooves 25, 35 may be provided on the inner surfaces 20a, 30a of the first and second pipes 20, 30 in order to promote transport of condensed cooling medium from the condenser part 3 to the evaporator part 2 by capillary forces. As exemplarily shown in FIG. 8, the inner surface 20a of the first pipe 20 may comprise a plurality of first grooves 25, and the inner surface 30a of the second pipe 30 may comprise a plurality of second grooves 35. FIG. 8, by way of example only, three parallel first grooves 25 and three parallel second grooves 35. Generally, any number of first grooves 25 may be provided about the whole inner circumference of the first pipe 20 and any number second grooves 35 may be provided about the whole inner circumference of the second pipe 30. Generally, the first grooves 25 may extend towards the first opening 23. For example, the first grooves 25 may extend from the rear end 22 to the front end 21 of the first pipe 20. Similar, the second grooves 35 may extend towards the second opening 33. For example, the second grooves 35 may extend from the rear end 32 to the front end 31 of the second pipe 30. As is schematically shown in FIG. 8, the first grooves 25 and the second grooves 35, in particular, at least some of the first and second grooves 25, 35 are aligned to each other. Thus, at least some of the first and second grooves 25, 35 open into each other and, thereby, form continuous channels for transporting condensed cooling medium by aid of capillary forces.

When the cooling device 1 as described above is employed for cooling windings 12 of the coil arrangement 10, as exemplarily shown in FIG. 2, the evaporator part 2 is arranged overlapping with the windings 12. In particular, the evaporator part 2 may be arranged adjacent to or in direct contact with the windings 12. As may be taken further from FIGS. 1 and 2, the evaporator part 2 may be arranged such that it extends along the rotational axis 105. Since the evaporator part 2 is made of a magnetically and electrically non-conductive material, induction of electrical currents into the evaporator part due to alternating magnetic fields generated by the windings 12 can be advantageously prevented.

FIGS. 2 and 3 exemplarily show the evaporator part 2 being arranged or sandwiched between the carrier part 11 and the windings 12. In particular, FIG. 3 shows a carrier part 11 realized as the stator yoke of an electric machine 100, wherein the evaporator part 2 is arranged at the bottom of a gap between two adjacent teeth 11B.

FIG. 4 exemplarily shows an alternative position of the evaporator part 2 overlapping with the windings 12. As is schematically shown in FIG. 4, the evaporator part 2 may be arranged between two adjacent windings 12 or layers of windings 12. Alternatively, the evaporator part 2 may also be arranged onto an outermost winding 12B or outermost layer of windings which is arranged facing away from the carrier part 11, as exemplarily shown in FIG. 5. FIGS. 4 and 5 also show the evaporator part 2 arranged in the gap between two adjacent teeth 11B of a stator yoke that forms the carrier part 11.

While the evaporator part 2 is arranged overlapping with the windings 12 and, hence, extends into an area subject to alternating magnetic fields, the condenser part 3 is arranged non-overlapping with or separated from the windings 12, as exemplarily shown in FIGS. 1 and 2. Thus, the condenser part 3 is arranged in an area where no or only weak alternating magnetic fields are present. For example, in an electric machine 100 that comprises the coil arrangement 10, e.g. the electric motor shown in FIG. 1, the condenser part 3 may protrude from an axial end 112 of the stator 110, e.g. along the rotational axis 105, as exemplarily shown in FIG. 1.

In the foregoing detailed description, various features are grouped together in one or more examples or examples with the purpose of streamlining the disclosure. It is to be understood that the above description is intended to be illustrative, and not restrictive. It is intended to cover all alternatives, modifications and equivalents. Many other examples will be apparent to one skilled in the art upon reviewing the above specification.

The embodiments were chosen and described in order to best explain the principles of the disclosure herein and its practical applications, to thereby enable others skilled in the art to best utilize the invention and various embodiments with various modifications as are suited to the particular use contemplated. In the appended claims and throughout the specification, the terms "including" and "in which" are used as the plain-English equivalents of the respective terms "comprising" and "wherein", respectively. Furthermore, "a" or "one" does not exclude a plurality in the present case.

While at least one example embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS 1 cooling device
2 evaporator part
3 condenser part
4 cooling ribs
10 coil arrangement
11 carrier part
12 windings
12B outermost windings
20 first pipe
20a inner surface of the first pipe
21 first axial/front end of the first pipe
21A metalized region
23 first opening
24 end wall
25 first grooves
30 second pipe
30a inner surface of the second pipe
30b outer surface of the second pipe
31 first axial/front end of the second pipe
33 second opening
34 end wall
35 second grooves
100 electric machine
105 rotational axis
110 stator
112 axial end of the stator
120 rotor
121 magnetic devices
130 output shaft
200 aircraft
210 fuselage
220 wings
230, 240 stabilizers
250 engines
251 fan
F fibers
P arrow
V2 first volume
V3 second volume

The invention claimed is:

1. A coil arrangement for generating or receiving alternating magnetic fields, comprising:
 a carrier part;
 a plurality of windings wound about the carrier part; and
 a cooling device for use in alternating magnetic fields, comprising:
  an evaporator part defining a first volume for evaporating a cooling medium contained therein, the evaporator part being made of an electrically and magnetically non-conductive ceramic material; and a condenser part defining a second volume for condensing the cooling medium contained therein, the condenser part being made of a metal material, and the condenser part being in fluid connection with the first volume;

wherein the evaporator part is formed by a first pipe comprising a first opening formed at an axial end of the first pipe;

wherein the condenser part comprises a second pipe comprising a second opening formed at an axial end of the second pipe; and wherein the axial end of the second pipe is introduced into the first opening of the first pipe;

wherein the evaporator part is overlapping with the windings; and wherein the condenser part is non-overlapping with or separated from the windings.

2. The coil arrangement according to claim 1, wherein the evaporator part is made of an AlSiC material.

3. The coil arrangement according to claim 1, wherein the condenser part is made of copper or aluminum.

4. The coil arrangement according to claim 1, wherein the first pipe includes an inner surface that defines a cross-section of the first volume, the inner surface being metalized in a region adjacent to the first opening, and wherein an outer surface of the second pipe is joined to the metalized region of the inner surface of the first pipe.

5. The coil arrangement according to claim 1, wherein non-conductive fibers extend from the second volume defined by the second pipe into the first volume defined by the first pipe to transport condensed cooling medium from the condenser part to the evaporator part by capillary forces.

6. The coil arrangement according to claim 1, wherein an inner surface of the first pipe that defines a cross-section of the first volume comprises a plurality of first grooves extending towards the first opening, wherein an inner surface of the second pipe that defines a cross-section of the second volume comprises a plurality of second grooves extending towards the second opening, and wherein the first grooves and the second grooves are aligned to each other to transport condensed cooling medium from the condenser part to the evaporator part by capillary forces.

7. The coil arrangement according to claim 1, wherein the evaporator part is between the carrier part and the windings.

8. The coil arrangement according to claim 1, wherein the evaporator part is between two adjacent windings.

9. The coil arrangement according to claim 1, wherein the evaporator part is arranged onto an outermost winding facing away from the carrier part.

10. An electric machine, comprising:
a stator comprising a coil arrangement according to claim 1, the stator defining a rotational axis; and
a rotor being rotatably mounted relative to the stator about the rotational axis.

11. The electric machine according to claim 10, wherein the evaporator part of the cooling device of the stator extends along the rotational axis, and wherein the condenser part protrudes from an axial end of the stator.

12. An aircraft comprising an electric machine according to claim 10.

13. A cooling device for use in alternating magnetic fields, comprising:
an evaporator part defining a first volume for evaporating a cooling medium contained therein, the evaporator part being made of an electrically and magnetically non-conductive material; and
a condenser part defining a second volume for condensing the cooling medium contained therein, the condenser part being in fluid connection with the first volume;
wherein the evaporator part is formed by a first pipe comprising a first opening formed at an axial end of the first pipe, wherein the condenser part comprises a second pipe comprising a second opening formed at an axial end of the second pipe;
wherein the first pipe includes an inner surface that defines a cross-section of the first volume, the inner surface being metalized in a region adjacent to the first opening;
wherein the axial end of the second pipe is introduced into the first opening of the first pipe; and
wherein an outer surface of the second pipe is joined to the metalized region of the inner surface of the first pipe.

* * * * *